United States Patent
McKay et al.

(10) Patent No.: US 6,418,551 B1
(45) Date of Patent: Jul. 9, 2002

(54) DESIGN RULE CHECKING TOOLS AND METHODS THAT USE WAIVER LAYOUT PATTERNS TO WAIVE UNWANTED DIMENSIONAL CHECK VIOLATIONS

(75) Inventors: Kerstin Kay McKay, Durham; Mark Preston Ammon, Apex; Mark Alan Grabski, Raleigh, all of NC (US)

(73) Assignee: Avant! Corporation, Fremont, CA (US)

( * ) Notice: Subject to any disclaimer, the term of this patent is extended or adjusted under 35 U.S.C. 154(b) by 55 days.

(21) Appl. No.: 09/715,342

(22) Filed: Nov. 17, 2000

Related U.S. Application Data

(60) Provisional application No. 60/222,750, filed on Aug. 3, 2000.

(51) Int. Cl.⁷ .............................................. G06F 17/50
(52) U.S. Cl. ......................................................... 716/5
(58) Field of Search ............................................. 716/5

(56) References Cited

U.S. PATENT DOCUMENTS

| | | | |
|---|---|---|---|
| 5,644,498 A | | 7/1997 | Joly et al. ........................ 716/2 |
| 5,681,674 A | | 10/1997 | Fujimoto ........................ 430/5 |
| 5,787,006 A | | 7/1998 | Chevallier et al. .............. 716/5 |
| 5,790,417 A | * | 8/1998 | Chao et al. ..................... 716/21 |
| 5,896,300 A | | 4/1999 | Raghavan et al. ............. 716/10 |
| 5,970,238 A | * | 10/1999 | Shibata et al. .................. 716/8 |
| 6,009,250 A | | 12/1999 | Ho et al. ........................ 716/5 |
| 6,009,251 A | | 12/1999 | Ho et al. ........................ 716/5 |
| 6,009,252 A | | 12/1999 | Lipton ............................ 716/5 |
| 6,011,911 A | | 1/2000 | Ho et al. ........................ 716/5 |
| 6,115,546 A | | 9/2000 | Chevallier et al. .............. 716/5 |
| 6,194,252 B1 | * | 2/2001 | Yamaguchi .................. 438/129 |

OTHER PUBLICATIONS

Shibata et al. (Japanese Patent Document No. JP–09306996–A, Nov. 28, 1997, front page only).*
Goto et al. (Japanese Patent Document No. JP–10050843–A, Feb. 20, 1998, front page only).*

* cited by examiner

*Primary Examiner*—Matthew Smith
*Assistant Examiner*—Phallaka Kik
(74) *Attorney, Agent, or Firm*—Myers Bigel Sibley & Sajovec

(57) ABSTRACT

A design rule checking (DRC) tool performs DRC operations by determining a match between one of a plurality of waiver layout patterns and a first portion of an integrated circuit layout containing a suspected violation of a first design rule. This operation is preferably performed automatically during a comprehensive DRC operation on the entire integrated circuit layout. Each violation of a design rule within an integrated circuit layout is preferably treated initially as a "suspected" violation prior to an operation to compare one or more different waiver layout patterns to the portion of the integrated circuit containing the "suspected" violation. A failure to identify a match with any of the waiver layout patterns operates to convert the "suspected" violation into a "confirmed" violation. At the end of the comprehensive DRC operation, separate files may be generated that list each of the occurrences of the suspected violations that have been waived and the confirmed violations that have not been waived.

20 Claims, 3 Drawing Sheets

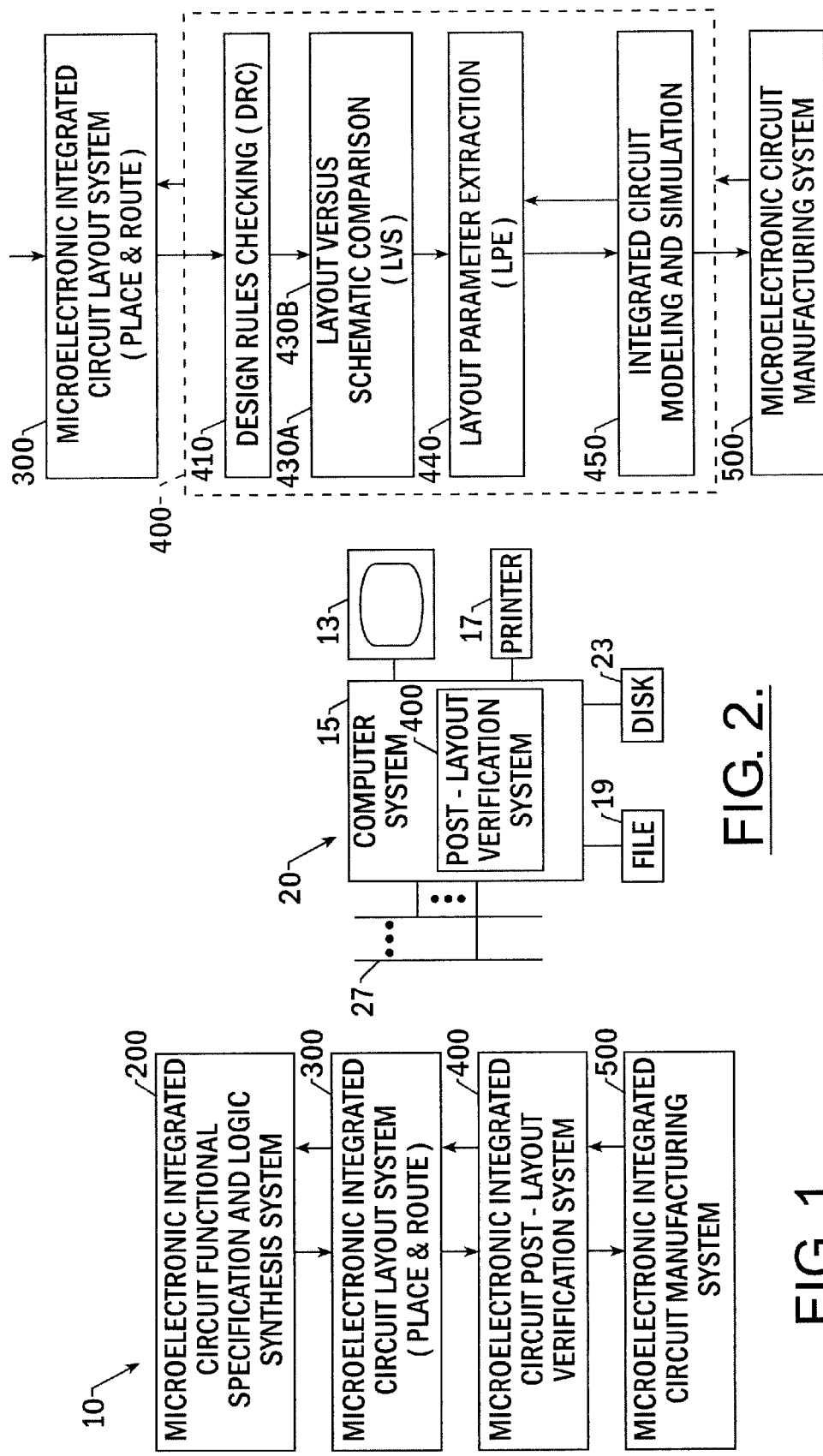

DESIGN RULE CHECKING TOOLS AND METHODS THAT USE WAIVER LAYOUT PATTERNS TO WAIVE UNWANTED DIMENSIONAL CHECK VIOLATIONS

REFERENCE TO PRIORITY APPLICATION

This application claims priority to U.S. Provisional Application Ser. No. 60/222,750, filed Aug. 3, 2000, the disclosure which is hereby incorporated herein by reference.

FIELD OF THE INVENTION

This invention relates to the design, layout, testing and manufacture of microelectronic circuits and systems, and more particularly to apparatus and methods for verifying microelectronic circuits and systems prior to manufacture.

BACKGROUND OF THE INVENTION

Present day ultra-large-scale integration (ULSI) circuits may include hundreds of thousands or millions of interconnected active electronic devices on an integrated circuit chip. The large capital investment required to fabricate and test large scale integrated circuits prior to sale to a customer and the difficulty, expense and loss of goodwill associated with reworking and replacing integrated circuits which fail to operate as planned, have increased the need to accurately characterize the electrical behavior of integrated circuits prior to their manufacture.

Moreover, now that submicron and deep-submicron (0.5 $\mu$m and below) technologies have begun to dominate silicon chip manufacturing and the prospect of million-plus-gate chips operating at clock rates of 100 MHZ has become a reality, fundamental changes have had to be made to conventional integrated circuit design methodologies and the electronic design automation (EDA) tools based thereon. To meet the challenges posed by such large-scale circuits, techniques have been developed to represent integrated circuit designs at various levels of abstraction. According to these techniques, an integrated circuit design may be represented by an electrical schematic containing devices and nets interconnecting the devices and by geometric layout data that describes patterns of regions or elements to be formed in and/or on an integrated circuit substrate (e.g., wafer). These patterns, which can be represented textually in software, are also frequently represented as colored polygons when viewed on a computer-aided-design (CAD) tool display.

Techniques for managing highly integrated circuit designs include hierarchical design techniques. Using such techniques, a particular design can be partitioned into functional cells and cells-within-cells, etc., so that at a given level of hierarchy the design may be analyzed as a set of cells and their respective interconnections, without being concerned with all the details of the contents of the cells (e.g., subcells within each cell).

These hierarchical techniques can be essential to the efficient performance of computer-assisted integrated circuit design verification. Such verification may include operations to perform hierarchical layout versus schematic comparison (LVS) and post-layout verification using hierarchical design rule checking (DRC) operations and other post-layout verification operations. Exemplary tools for performing post-layout verification operations are described more fully in commonly assigned U.S. Pat. No. 5,896,300 to Raghavan et al., entitled "Methods, Apparatus and Computer Program Products for Performing Post-Layout Verification of Microelectronic Circuits By Filtering Timing Error Bounds for Layout Critical Nets", the disclosure of which is hereby incorporated herein by reference. An exemplary tool for performing LVS comparison is also more fully described in commonly assigned U.S. Pat. No. 6,009,252 to Lipton, entitled "Methods, Apparatus and Computer Program Products for Determining Equivalencies Between Integrated Circuit Schematics and Layouts Using Color Symmetrizing Matrices", the disclosure of which is hereby incorporated by reference.

A conventional technique for performing design rule checking (DRC) is described in U.S. Pat. No. 6,115,546 to Chevallier et al., entitled "Apparatus and Method for Management of Integrated Circuit Layout Verification Processes". This technique performs operations to access a database upon completion of a DRC or LVS operation and queries a user as to whether a cell should be marked as successfully passing the appropriate verification procedure. A user is also able to access a report generating module to inspect the verification status of a cell in the IC design and generate a report showing the status of the verification procedures for each cell, organized according to one of several criteria. Another conventional technique for performing design rule checking is described in U.S. Pat. No. 6,011,911 to Ho et al., entitled "Layout Overlap Detection With Selective Flattening In Computer Implemented Integrated Circuit Design". In this technique, when instances of cells overlap, an overlap area is determined using predefined data structures that divide each cell into an array of spatial bins. Each bin associated with a parent cell is examined to determine if two or more cell instances reside therein or if a cell instance and local geometry reside therein. Once overlap is detected, the areas of the layout data corresponding to the overlap areas are selectively flattened prior to DRC and LVS processing.

Other techniques for performing DRC operations on layouts of highly integrated circuits include identifying portions of a layout where one or more design rules are not to be checked when a DRC operation is performed on the layout. Unfortunately, this technique typically requires manual identification within the layout of each instance where a particular design rule is not to be checked. For example, this technique may require the manual editing of a cell to include a polygon covering a particular region where a DRC violation is present or anticipated and then NOTing away any design rule check of this particular region when the DRC operation is performed. This manual identification process can be very time consuming, particularly when an instance applies to a highly repetitive structure such as a memory cell within an highly integrated memory cell array. Thus, notwithstanding these conventional techniques for verifying integrated circuit layouts for compliance with design rules, there continues to be a need for more efficient techniques for verifying integrated layouts.

SUMMARY OF THE INVENTION

Embodiments of the present invention enable a user to automatically waive, or disregard, selected dimensional check violations when running design rule checking operations on integrated circuit layouts. This automatic waiver option is provided by the use of one or more waiver layout patterns (e.g., waiver "cells") that are preferably evaluated after a suspected DRC violation has been identified. In particular, each of the waiver layout patterns is preferably designed to address a respective dimensional check violation that would otherwise be identified as a confirmed DRC violation (i.e., violation of a respective DRC rule) at the conclusion of a DRC operation. Waiving one or more design rule violations may be advantageous in those circumstances where a portion of a layout containing a known "technical" violation of a design rule is also known to yield acceptable performance when manufactured. This is particularly true when the "technical" violation is within a child cell (e.g., memory cell) that is replicated numerous times within a larger hierarchical design and, therefore, when generating a file highlighting these numerous technical violations would be cumbersome for a user to review and evaluate.

According to a first preferred method of checking an integrated circuit layout for design rule violations, an operation is performed to determine a match between a waiver layout pattern and a first portion of an integrated circuit layout containing a suspected violation of a first design rule. This operation is preferably performed automatically during a comprehensive DRC operation on the entire integrated circuit layout. Each violation of a design rule is preferably treated initially as a "suspected" violation prior to an operation to compare one or more different waiver layout patterns to the portion of the integrated circuit containing the "suspected" violation. A failure to identify a match with any of the waiver layout patterns operates to convert the "suspected" violation into a "confirmed" violation. At the end of the comprehensive DRC operation, separate files may be generated that list each of the occurrences of the suspected violations that have been waived and the confirmed violations that have not been waived.

According to another preferred method of verifying an integrated circuit layout, operations are performed to evaluate an integrated circuit layout to determine a plurality of suspected violations of design rules, and to determine if a match exists between a waiver layout pattern and a portion of the integrated circuit layout that includes a first suspected violation from within the plurality of suspected violations. A plurality of confirmed violations of the design rules are then determined as a subset of the plurality of suspected violations by omitting the first suspected violation if a match has been determined. The operation to determine a match preferably includes operations to determine whether each and every critical edge of the waiver layout pattern can be mapped to a respective edge in the integrated circuit layout, regardless of orientation. Typically, a violation may only be waived when each and every edge that is entirely within an extent of the waiver layout pattern can be mapped to a respective edge in a portion of the integrated circuit layout containing the suspected violation. A dummy layout pattern may be used to define a larger extent of the waiver layout patterns and increases the number of edges that may be treated as critical edges. Embodiments of the present invention also include computer-program products embodying instructions that can be processed to perform the preferred operations, as well as computer-aided design tools that include hardware and software to perform the preferred operations.

BRIEF DESCRIPTION OF THE DRAWINGS

FIG. 1 illustrates a functional block diagram of microelectronic integrated circuit synthesis, layout, verification and manufacturing tools according to embodiments of the present invention.

FIG. 2 illustrates a general hardware description of post-layout verification tools according to embodiments of the present invention.

FIG. 3 illustrates general operations performed by post-layout verification tools, methods and computer program products according to embodiments of the present invention.

DESCRIPTION OF A PREFERRED EMBODIMENT

Figure 4:
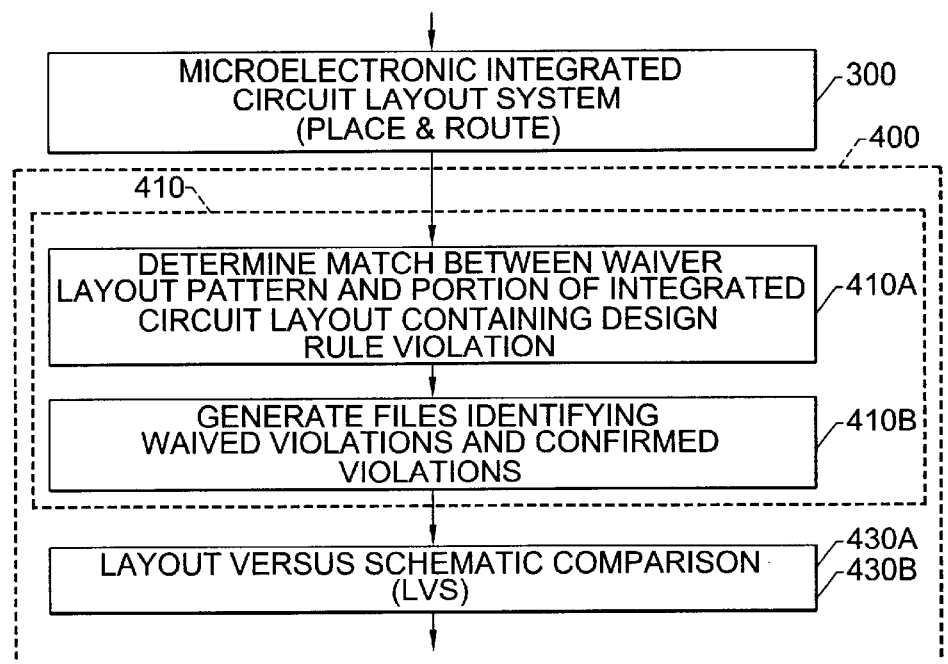
FIG. 4 is a flowchart illustrating operations performed by design rule checking tools according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. The operations of the present invention, as described more fully hereinbelow, may be performed by an entirely hardware embodiment, an entirely software embodiment or an embodiment combining software and hardware aspects. Furthermore, the present invention may take the form of a computer program product on a computer-readable storage medium having computer-readable program code embodied in the medium. Any suitable computer-readable medium may be utilized including hard disks, CD-ROMs or other optical or magnetic storage devices. Like numbers refer to like elements throughout.

Referring now to FIG. 1, operations performed by a preferred computer aided microelectronic integrated circuit synthesis, layout, verification and manufacturing system 10 will be generally described. The system may include four general subsystems: an integrated circuit functional specification and logic synthesis system 200, an integrated circuit layout system 300, a post-layout verification system 400 and an integrated circuit manufacturing system 500. The microelectronic integrated circuit functional specification and logic synthesis system 200 may include circuit libraries or macros for such elements as logic gates, flip-flops, registers, memory elements, drivers and buffers, for example. The functional specification and logic synthesis system 200 typically provides a vehicle for generating and displaying an electrical schematic of an integrated circuit and producing a computer readable representation of the schematic as a design netlist. The microelectronic integrated circuit layout system 300 typically provides a vehicle for generating a physical layout by placing and routing an electrical circuit schematic generated by the functional specification and logic synthesis system 200. A wiring program may also be provided with the layout system 300 for automatically determining the placement of the wiring interconnect nets between active device elements within the microelectronic integrated circuit.

A verification system 400 is also preferably provided for performing an independent verification of the physical layout to ensure compliance with the requirements of the functional specification and logic synthesis system 200 as well as the manufacturing system 500. Accordingly, the verification system 400 is typically referred to as a "post-layout" verification system and is typically employed near the end of the design process. In addition to acting as an independent verification of the operability and correctness of the layout of the circuit design, the verification system 400 may provide means by which changes and optimizations can be performed. As will be understood by those skilled in the art, various other types of analyses such as timing analysis and circuit/logic simulation may be performed to check whether the specifications and requirements of the first two subsystems 200 and 300 are satisfied. After verification, the physical layout is forwarded to the manufacturing system 500 to produce the integrated circuit. The microelectronic circuit manufacturing system 500 may generate the required masks, and may control the manufacturing tools necessary to fabricate the integrated circuit on a semiconductor wafer, for example.

It will be understood by those having skill in the art that the integrated circuit functional specification and logic synthesis system 200, microelectronic circuit layout system 300 and various parts of the microelectronic integrated circuit manufacturing system 500 may be realized in whole or in part as software modules running on a computer system. Alternatively, a dedicated stand-alone system with application specific integrated circuits for performing the above described functions may be provided. The general design and operation of the functional specification and logic synthesis system 200, layout system 300 and manufacturing system 500 are well known to those having a skill in the art and need not be described further herein.

Referring now to FIG. 2, a general hardware description of a computer workstation containing, among other things, the integrated circuit post-layout verification system 400 of FIG. 1 will be described. As shown by FIG. 2, the workstation 20 preferably includes a computer 15 containing a post-layout verification software sub-system 400 running thereon. The post-layout verification system 400 may accept a computer representation of the electrical schematic and layout of an integrated circuit via a file 19, disk input 23 or data bus 27. A display 13 and a printer 17 are also preferably provided to assist in verifying the layout and design of the integrated circuit. The hardware design of the above described components 13, 17, 19, 27 and 23 is well known to those having skill in the art and need not be described further herein. As one example, the post-layout verification system 400 may be installed on a computer system such as an UltraSPARC 5 workstation manufactured by Sun Microsystems Computer Corporation (see, http://www.sun.com).

Referring now to FIG. 3, there is illustrated a general overview of operations that are preferably performed by embodiments of post-layout verification systems 400 of the present invention. In particular, the post-layout verification system 400 is illustrated as performing a plurality of operations 410, 430A–430B and 440–450. For the sake of clarity, these operations are illustrated and described as discrete operations, however, in practice many of these operations may be combined and performed in parallel and/or in a different order than illustrated. Additional operations may also be performed by the post-layout verification system 400. As described more fully hereinbelow, the first operation 410 is performed by a preferred design rule checking (DRC) tool which runs comprehensive design rule checks on a geometric database containing the physical layout of an integrated circuit to be verified. The operations performed by the design rule checking tool include, among other things, checking for area, grid, length, size, spacing, corner, enclosure, intersection and overlap errors, for example. The second operations 430A–430B are performed by a preferred hierarchical layout versus schematic (LVS) tool which extracts a hierarchical netlist from the geometric layout database and compares it to the electrical schematic netlist. Layout and schematic logic agreement is then verified at hierarchical matching points, for example. A preferred LVS tool is more fully described in commonly assigned U.S. patent application Ser. No. 09/505,499 to Lipton et al., filed Feb. 17, 2000, entitled "Methods, Apparatus and Computer Program Products that Determine Equivalencies Between Integrated Circuit Schematics and Layouts by Recoloring Swappable Nodes", the disclosure of which is hereby incorporated herein by reference.

The third operation 440 is performed by a layout parameter extraction (LPE) tool. This tool may, among other things, perform an initial operation of modeling each of a plurality of interconnect nets within the integrated circuit layout in order to obtain estimates of the parasitic resistance and capacitance of the nets. A preferred LPE tool is described in detail in the aforementioned patent to Raghavan et al. Once this layout parameter extraction operation 440 is complete, modeling and simulation operations 450 are performed. The results obtained from these modeling and simulation operations may also be passed back to the layout parameter extraction tool 440. As illustrated by the reverse upward sequence of arrows in FIGS. 1 and 3, the performance of post-layout verification may necessitate redesign of the integrated circuit by the functional specification and logic synthesis system 200 and/or modifying the physical layout using the layout system 300. Finally, in the event the integrated circuit is verified for design rule compliance and the layout versus schematic (LVS) comparison and modeling and simulation operations yield acceptable results, the physical layout is forwarded to the manufacturing system 500 to produce the integrated circuit.

Referring again to Block 410 of FIG. 3 and the flowchart illustration of FIG. 4, a detailed description of the operations performed by preferred design rule checking (DRC) tools will now be provided. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means that implement the functions specified in the flowchart block or blocks. These computer program instructions may also be stored in a computer-readable memory that can direct a processor or other programmable data processing apparatus to function in a particular manner, such that the instructions stored in the computer-readable memory produce an article of manufacture including instruction means that implement the functions specified in the flowchart block or blocks. Accordingly, blocks of the flowchart illustration support combinations of means that perform the specified functions, combinations of steps that perform the specified functions and program instruction means that perform the specified functions.

Referring now to the flowchart illustration of FIG. 4, preferred methods of checking an integrated circuit layout for design rule violations include operations to determine a match between a waiver layout pattern and a first portion of an integrated circuit containing a suspected violation of a first design rule, Block 410A. This waiver layout pattern may be one of a plurality of waiver layout patterns that are retained within a waiver layout pattern library, with each waiver layout pattern corresponding to a respective instance of a layout pattern that violates at least one design rule. If a match is present, the suspected violation is classified as a "waived" violation. Alternatively, if a match is not present, the suspected violation is classified as a "confirmed" violation. Files identifying waived violations and confirmed violations may then be generated, Block 410B.

The preferred operations to determine a match, Block 410A, include evaluating an integrated circuit layout against a plurality of design rules to identify a plurality portions of the layout that contain suspected violations. Once these suspected violations have been identified, a library of waiver layout patterns (e.g., waiver cells) may then be scanned to determine whether a match exists between a particular waiver layout pattern and a portion of the layout containing a suspected violation. Each waiver layout pattern in the library preferably corresponds to a respective instance of a design rule violation that is to be waived. For example, the waiver layout pattern may be defined by first and second polygons that by their shape or spacing relative to each other violate a particular design rule. These first and second polygons may represent first and second different material patterns, respectively. Operations to determine a match preferably comprise evaluating whether each critical edge of a particular waiver layout pattern can be mapped to a respective edge in the portion of the layout containing the suspected violation.

Figure 5A:
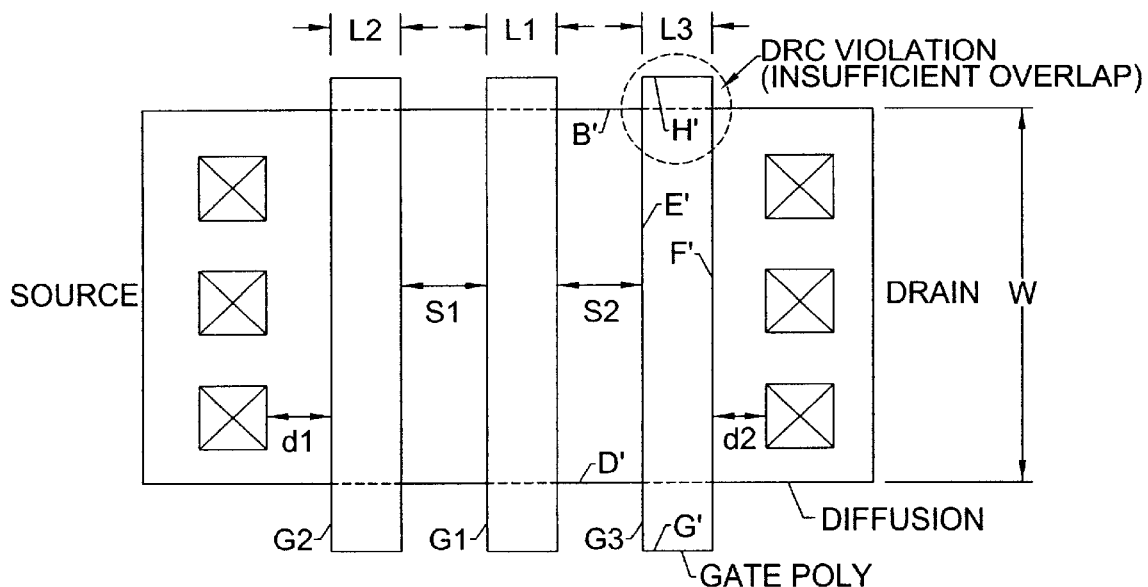
FIG. 5A is a layout view of an integrated circuit device having a design rules violation therein. This device may be a child cell within a hierarchical design.

An application of the preferred operations to determine a match between a portion of a hypothetical integrated circuit layout and a hypothetical waiver layout pattern will now be described with reference to FIGS. 5A–5C. In particular, FIG. 5A illustrates a layout pattern of an NMOS field effect transistor having three polysilicon gate electrodes (G1, G2 and G3). As illustrated, these three gate electrodes have gate lengths L1–L3 and are spaced from each other by distances equal to S1 and S2. A rectangular pattern representing a source/drain diffusion region is also illustrated as extending underneath the three gate electrodes. The diffusion region has a width "W". A plurality of square source contact regions and square drain contact regions are also provided. The source contact regions are spaced from the second gate electrode G2 by a distance d1 and the drain contact regions are spaced from the third gate electrode G3 by a distance d2. As illustrated by the dotted circle, a DRC violation is present between an end of the gate poly pattern representing the third gate electrode G3 and the underlying diffusion region. Although not highlighted, similar DRC violations may also be present between the other gate poly patterns G1 and G2 and the underlying diffusion region. In particular, the highlighted DRC violation represents an "insufficient overlap" type of ground rules violation between the gate poly pattern and the diffusion region pattern. This violation may result from an insufficient spacing between edge H' of the gate poly pattern and edge B' of the diffusion pattern, for example.

Figure 5B:
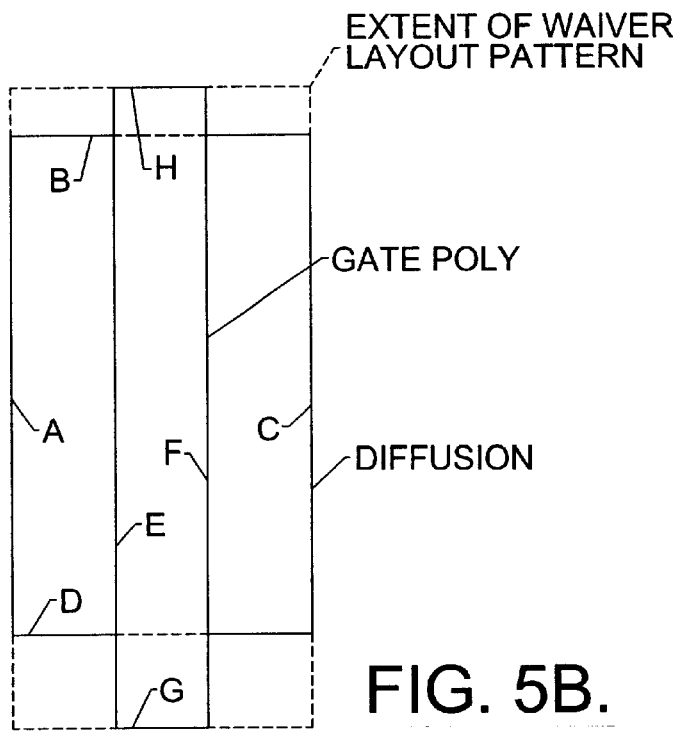
FIG. 5B is a layout view of a waiver layout pattern that can be mapped to the portion of the device of FIG. 5A having the violation.

Referring now to FIG. 5B, a waiver layout pattern is illustrated as comprising a gate poly pattern and a diffusion pattern. The extent of the waiver layout pattern is illustrated by the dotted line which overlaps edges H and G of the gate poly pattern and edges A and C of the diffusion region pattern. Edges associated with the waiver layout pattern may be critical edges if and only if they lie within the extent of the waiver layout pattern. Based on this definition of a critical edge, edges B, D, E and F are critical edges and edges A, C, H and G are non-critical edges. The shape of the waiver layout pattern is preferably defined so that each of the critical edges may be mapped to a respect edge in the portion of the integrated circuit layout containing the suspected violation. The same waiver layout pattern may also be used to identify additional violations in other portions (e.g., other child cells) within the integrated circuit layout. During the operation to determine a presence of a match between the waiver layout pattern of FIG. 5B and the portion of a layout pattern of FIG. 5A containing a suspected violation, a check is made to determine whether edges B, D, E and F of the waiver layout pattern may be mapped to edges B', D', E' and F' of the portion of the layout pattern. These edges B', D', E' and F' may be within a critical boundary of the layout pattern of FIG. 5A. This critical boundary may correspond in shape and dimension to the extent of the waiver layout pattern of FIG. 5B as translated to the layout pattern of FIG. 5A.

Figure 5C:
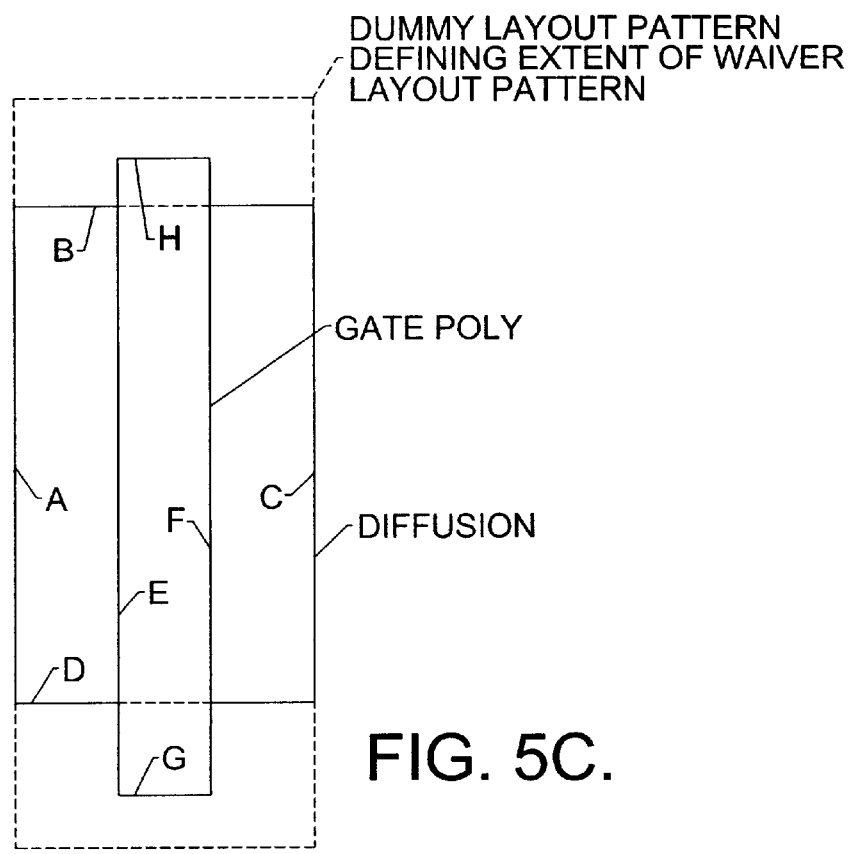
FIG. 5C is another layout view of a waiver layout pattern than can be mapped to the portion of the device of FIG. 5A having the violation.

As illustrated by FIG. 5C, the waiver layout pattern may also include a dummy layout pattern that operates as a bounding box which defines an extent of the waiver layout pattern. Here, the dummy layout pattern may be provided as single polygon which surrounds a waiver layout pattern comprising a plurality of polygon patterns. By using a dummy layout pattern to define a larger extent of the waiver layout pattern, additional edges may be treated as critical edges. This improves the accuracy of the matching operations and inhibits the waiving of violations that should be flagged as confirmed violations. For example, by expanding the extent of the waiver layout pattern using a dummy layout pattern, non-critical edges H and G within the waiver layout pattern of FIG. 5B may now be considered as critical edges within the waiver layout pattern of FIG. 5C. Nonetheless, edges A and C which overlap the dummy layout pattern cannot be mapped to a corresponding edge on the portion of the integrated circuit layout illustrated by FIG. 5A. Thus, a first violation of a first design rule within a first portion of an integrated circuit layout may be "tagged" as a waived violation if each edge that is entirely within an extent of a first waiver layout pattern can be mapped to a respective edge in the first portion of the integrated circuit layout. Other suspected violations that cannot be waived are tagged as confirmed violations. Separate files containing lists of waived and confirmed violations may then be generated for evaluation by a user of a post-layout verification tool.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of verifying an integrated circuit layout, comprising the steps of:

evaluating an integrated circuit layout against design rules to determine a plurality of suspected violations of the design rules;

determining a match between a waiver layout pattern and a portion of the integrated circuit layout that includes a first suspected violation from within the plurality of suspected violations; and determining a plurality of confirmed violations of the design rules as a subset of the plurality of suspected violations by omitting the first suspected violation if a match has been determined.

2. The method of claim 1, wherein said step of determining a match comprises determining whether each critical edge of the waiver layout pattern can be mapped to a respective edge in the integrated circuit layout.

3. The method of claim 2, wherein the first suspected violation is within a critical boundary associated with the integrated circuit layout; wherein an extent of the waiver layout pattern overlaps a plurality of non-critical edges of the waiver layout pattern; and wherein the critical boundary corresponds to the extent of the waiver layout pattern.

4. The method of claim 3, wherein the critical boundary is determined by translating the extent of the waiver layout pattern to the integrated circuit layout.

5. The method of claim 3, wherein the extent of the waiver layout pattern is defined by a dummy layout polygon.

6. The method of claim 5, wherein the dummy layout polygon has an edge that overlaps a non-critical edge of a first material layer polygon within the waiver layout pattern.

7. A method of verifying an integrated circuit layout, comprising the steps of:

evaluating an integrated circuit layout against a first design rule to determine a first violation of the first design rule; and tagging the first violation as a waived violation if a match is present between a first waiver layout pattern and a first portion of the integrated circuit layout that incorporates the first violation.

8. The method of claim 7, wherein said tagging step comprises tagging the first violation as a waived violation if and only if each edge that is entirely within an extent of the first waiver layout pattern can be mapped to a respective edge in the first portion of the integrated circuit layout.

9. The method of claim 8, wherein the extent of the first waiver layout pattern is defined by a dummy layout pattern.

10. The method of claim 7, wherein the first waiver layout pattern is defined by a plurality of polygons that identify respective different material layers.

11. The method of claim 10, wherein said tagging step comprises tagging the first violation as a waived violation if and only if each edge that is entirely within an extent of the first waiver layout pattern can be mapped to a respective edge in the first portion of the integrated circuit layout.

12. The method of claim 11, wherein the extent of the first waiver layout pattern comprises an edge from each of first and second polygons with the plurality of polygons.

13. The method of claim 12, wherein the first waiver layout pattern comprises a dummy polygon having at least one edge that cannot be mapped to the first portion of the integrated circuit layout.

14. A method of checking an integrated circuit layout for design rule violations, comprising the step of:

determining a match between a waiver layout pattern and a first portion of an integrated circuit layout containing a violation of a first design rule.

15. The method of claim 14, wherein said determining step comprises determining a match between a waiver layout pattern and a first portion of the integrated circuit layout if and only if each critical edge of the waiver layout pattern can be mapped to a respective edge in the first portion of the integrated circuit layout.

16. The method of claim 15, further comprising the step of:

generating a file containing an entry identifying the violation as being waived.

17. The method of claim 15, wherein the waiver layout pattern is defined by first and second polygons that represent first and second material patterns, respectively; and wherein a spacing between the first and second polygons violates the first design rule.

18. A computer program product that checks an integrated circuit layout for design rule violations, said product comprising a computer-readable storage medium having computer-readable program code embodied in said medium, said computer-readable program code comprising:

computer-readable program code that determines a match between a waiver layout pattern and a first portion of an integrated circuit layout containing a violation of a first design rule.

19. The computer program product of claim 18, wherein said computer-readable program code comprises computer-readable program code that determines a match between a waiver layout pattern and a first portion of the integrated circuit layout if and only if each critical edge of the waiver layout pattern can be mapped to a respective edge in the first portion of the integrated circuit layout.

20. The computer program product of claim 18, wherein said computer-readable program code comprises computer-readable program code that determines a match between a waiver layout pattern and a first portion of the integrated circuit layout by evaluating whether at least one critical edge of the waiver layout pattern can be mapped to a respective edge in the first portion of the integrated circuit layout.

* * * * *